(12) United States Patent
Ku et al.

(10) Patent No.: US 6,955,211 B2
(45) Date of Patent: Oct. 18, 2005

(54) METHOD AND APPARATUS FOR GAS TEMPERATURE CONTROL IN A SEMICONDUCTOR PROCESSING SYSTEM

(75) Inventors: Vincent W. Ku, San Jose, CA (US); Ling Chen, Sunnyvale, CA (US); Dien-Yeh Wu, San Jose, CA (US); Alan H. Ouye, San Mateo, CA (US); Irena Wysok, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

(21) Appl. No.: 10/197,683

(22) Filed: Jul. 17, 2002

(65) Prior Publication Data

US 2004/0011504 A1 Jan. 22, 2004

(51) Int. Cl.$^7$ ............................................... F25B 29/00
(52) U.S. Cl. ............................ 165/47; 165/58; 438/799
(58) Field of Search ............................ 165/47, 157, 58; 438/799

(56) References Cited

U.S. PATENT DOCUMENTS

| | | | |
|---|---|---|---|
| 4,058,430 A | 11/1977 | Suntola et al. | 156/611 |
| 4,066,481 A | 1/1978 | Manasevit et al. | 148/174 |
| 4,193,835 A | 3/1980 | Inoue et al. | 156/606 |

(Continued)

FOREIGN PATENT DOCUMENTS

| | | | |
|---|---|---|---|
| EP | 0 435 008 | 7/1991 | C23C/16/44 |
| EP | 1 167 569 | 1/2002 | C23C/16/455 |
| GB | 1120650 | 7/1968 | C23C/11/00 |

(Continued)

OTHER PUBLICATIONS

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

Kukli, et al., "In situ Study of Atomic Layer Epitaxy Growth of Tantalum Oxide Thin Films From $Ta(OC_2H_5)_5$ and $H_2O$," Applied Surface Science, vol. 112, Mar. 1997, p. 236–42.

(Continued)

Primary Examiner—Ljiljana Ciric
(74) Attorney, Agent, or Firm—Moser, Patterson & Sheridan, LLP

(57) ABSTRACT

A method and apparatus for controlling the temperature of at least one gas flowing into a processing chamber is provided. In one embodiment, a gas temperature control apparatus for semiconductor processing includes a gas delivery line coupled between a processing chamber and a gas source. An enclosure substantially encloses the gas delivery line and is adapted to flow a heat transfer fluid away from the processing chamber.

19 Claims, 2 Drawing Sheets

U.S. PATENT DOCUMENTS

| | | | |
|---|---|---|---|
| 4,389,973 A | 6/1983 | Suntola et al. | 118/725 |
| 4,413,022 A | 11/1983 | Suntola et al. | 427/255.2 |
| 4,529,427 A | 7/1985 | French | 65/3.12 |
| 4,650,539 A | 3/1987 | Irvine et al. | 156/613 |
| 4,834,831 A | 5/1989 | Nishizawa et al. | 156/611 |
| 4,845,054 A | 7/1989 | Mitchener | 437/238 |
| 4,950,621 A | 8/1990 | Irvine et al. | 437/81 |
| 4,993,357 A | 2/1991 | Scholz | 118/715 |
| 5,186,120 A | 2/1993 | Ohnishi et al. | 118/667 |
| 5,225,366 A | 7/1993 | Yoder | 437/108 |
| 5,262,356 A | 11/1993 | Fujii | 437/225 |
| 5,281,274 A | 1/1994 | Yoder | 118/697 |
| 5,294,286 A | 3/1994 | Nishizawa et al. | 156/610 |
| 5,308,433 A | 5/1994 | Otsuka et al. | 117/93 |
| 5,374,570 A | 12/1994 | Nasu et al. | 437/40 |
| 5,441,703 A | 8/1995 | Jurgensen | 422/129 |
| 5,443,647 A | 8/1995 | Aucoin et al. | 118/723 |
| 5,480,818 A | 1/1996 | Matsumoto et al. | 437/40 |
| 5,483,919 A | 1/1996 | Yokoyama et al. | 117/89 |
| 5,503,875 A | 4/1996 | Imai et al. | 427/255.3 |
| 5,531,183 A | 7/1996 | Sivaramakrishnam et al. | 117/93 |
| 5,616,208 A * | 4/1997 | Lee | 118/715 |
| 5,674,786 A | 10/1997 | Turner et al. | 437/225 |
| 5,711,811 A | 1/1998 | Suntola et al. | 118/711 |
| 5,796,116 A | 8/1998 | Nakata et al. | 257/66 |
| 5,807,792 A | 9/1998 | Ilg et al. | 438/758 |
| 5,835,677 A | 11/1998 | Li et al. | 392/401 |
| 5,855,680 A | 1/1999 | Soininen et al. | 118/719 |
| 5,879,459 A | 3/1999 | Gadgil et al. | 118/715 |
| 5,916,365 A | 6/1999 | Sherman | 117/92 |
| 5,923,056 A | 7/1999 | Lee et al. | 257/192 |
| 6,015,590 A | 1/2000 | Suntola et al. | 427/255.23 |
| 6,015,917 A | 1/2000 | Bhandari et al. | 556/12 |
| 6,042,652 A | 3/2000 | Hyun et al. | 118/719 |
| 6,084,302 A | 7/2000 | Sandhu | 257/751 |
| 6,124,158 A | 9/2000 | Dautartas et al. | 438/216 |
| 6,139,700 A | 10/2000 | Kang et al. | 204/192.17 |
| 6,144,060 A | 11/2000 | Park et al. | 257/310 |
| 6,174,377 B1 | 1/2001 | Doering et al. | 118/729 |
| 6,174,809 B1 | 1/2001 | Kang et al. | 438/682 |
| 6,183,563 B1 | 2/2001 | Choi et al. | 118/715 |
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,487 B1 | 3/2001 | Kim et al. | 438/238 |
| 6,231,672 B1 | 5/2001 | Choi et al. | 118/715 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 10/2001 | Sneh et al. | 118/723 |
| 6,306,216 B1 | 10/2001 | Kim et al. | 118/725 |
| 6,342,277 B1 | 1/2002 | Sherman | 427/562 |
| 6,348,376 B2 | 2/2002 | Lim et al. | 438/253 |
| 6,358,829 B2 | 3/2002 | Yoon et al. | 438/597 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 437/704 |
| 6,399,491 B2 | 6/2002 | Jeon et al. | 438/680 |
| 6,416,577 B1 | 7/2002 | Suntola et al. | 117/88 |
| 6,416,822 B1 | 7/2002 | Chiang et al. | 427/561 |
| 6,428,859 B1 | 8/2002 | Chiang et al. | 427/457 |
| 6,447,607 B2 | 9/2002 | Soininen et al. | 117/200 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,478,872 B1 | 11/2002 | Chae et al. | 117/88 |
| 6,481,945 B1 | 11/2002 | Hasper et al. | 414/217 |
| 6,482,262 B1 | 11/2002 | Elers et al. | 117/84 |
| 6,482,733 B2 | 11/2002 | Raaijmakers | 438/633 |
| 6,511,539 B1 | 1/2003 | Raaijmakers | 117/102 |
| 6,551,406 B2 | 4/2003 | Kilpi | 118/728 |
| 2001/0000866 A1 | 5/2001 | Sneh et al. | 118/723 |
| 2001/0002280 A1 | 5/2001 | Sneh | 427/255.28 |
| 2001/0009140 A1 | 7/2001 | Bondestan et al. | 118/725 |
| 2001/0009695 A1 | 7/2001 | Saanila et al. | 427/255.39 |
| 2001/0011526 A1 | 8/2001 | Doering et al. | 118/729 |
| 2001/0013312 A1 | 8/2001 | Soininen et al. | 117/86 |
| 2001/0014371 A1 | 8/2001 | Kilpi | 427/255.28 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0042523 A1 | 11/2001 | Kesala | 122/6.6 |
| 2001/0042799 A1 | 11/2001 | Kim et al. | 239/553 |
| 2001/0054377 A1 | 12/2001 | Lindfors et al. | 117/104 |
| 2001/0054730 A1 | 12/2001 | Kim et al. | 257/301 |
| 2001/0054769 A1 | 12/2001 | Raaijmakers et al. | 257/758 |
| 2002/0000196 A1 | 1/2002 | Park | 118/715 |
| 2002/0000598 A1 | 1/2002 | Kang et al. | 257/301 |
| 2002/0007790 A1 | 1/2002 | Park | 118/715 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0041931 A1 | 4/2002 | Suntola et al. | 427/255.28 |
| 2002/0048635 A1 | 4/2002 | Kim et al. | 427/331 |
| 2002/0052097 A1 | 5/2002 | Park | 438/507 |
| 2002/0066411 A1 | 6/2002 | Chiang et al. | 118/724 |
| 2002/0068458 A1 | 6/2002 | Chiang et al. | 438/694 |
| 2002/0073924 A1 | 6/2002 | Chiang et al. | 118/723 R |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0082296 A1 | 6/2002 | Verschoor et al. | 514/557 |
| 2002/0086106 A1 | 7/2002 | Park et al. | 427/248.1 |
| 2002/0092471 A1 | 7/2002 | Kang et al. | 118/715 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 |
| 2002/0106536 A1 | 8/2002 | Lee et al. | 428/702 |
| 2002/0108570 A1 | 8/2002 | Lindfors | 118/715 |
| 2002/0134307 A1 | 9/2002 | Choi | 118/715 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al. | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0197402 A1 | 12/2002 | Chiang et al. | 427/255.39 |
| 2003/0004723 A1 | 1/2003 | Chihara | 704/260 |
| 2003/0013320 A1 | 1/2003 | Kim et al. | 438/778 |
| 2003/0031807 A1 | 2/2003 | Elers et al. | 427/569 |
| 2003/0042630 A1 | 3/2003 | Babcoke et al. | 261/121.1 |
| 2003/0049942 A1 | 3/2003 | Haukka et al. | 438/778 |
| 2003/0072975 A1 | 4/2003 | Shero et al. | 428/704 |
| 2003/0075273 A1 | 4/2003 | Kilpela et al. | 156/345.33 |
| 2003/0075925 A1 | 4/2003 | Lindfors et al. | 285/367 |

FOREIGN PATENT DOCUMENTS

| | | | |
|---|---|---|---|
| GB | 2 355 727 | 5/2001 | C23C/16/44 |
| JP | 58098917 | 6/1983 | H03J/7/02 |
| JP | 4291916 | 9/1992 | C30B/25/10 |
| JP | 5047666 | 2/1993 | H01L/21/205 |

| | | | |
|---|---|---|---|
| JP | 5206036 | 8/1993 | H01L/21/205 |
| JP | 5234899 | 9/1993 | H01L/21/205 |
| JP | 5270997 | 10/1993 | C30B/29/68 |
| JP | 6224138 | 5/1994 | C30B/25/14 |
| JP | 2000319772 | 3/2000 | C23C/16/00 |
| JP | 2001020075 | 11/2000 | C23C/16/44 |
| JP | 2001111000 | 4/2001 | H01L/27/105 |
| JP | 2001172767 | 6/2001 | C23C/16/40 |
| WO | WO 96/17107 | 6/1996 | C23C/16/44 |
| WO | WO 99/01595 | 1/1999 | C30B/25/14 |
| WO | WO 99/29924 | 6/1999 | C23C/16/04 |
| WO | WO 99/65064 | 12/1999 | H01L/21/00 |
| WO | WO 0016377 | 3/2000 | |
| WO | WO 00/54320 | 9/2000 | H01L/21/44 |
| WO | WO 00/79576 | 12/2000 | H01L/21/205 |
| WO | WO 01/15220 | 3/2001 | H01L/21/768 |
| WO | WO 01/17692 | 3/2001 | B05C/11/00 |
| WO | WO 01/27346 | 4/2001 | C23C/16/44 |
| WO | WO 01/27347 | 4/2001 | C23C/16/44 |
| WO | WO 01/29280 | 4/2001 | C23C/16/32 |
| WO | WO 01/29891 | 4/2001 | H01L/21/768 |
| WO | WO 01/29893 | 4/2001 | H01L/21/768 |
| WO | WO 01/36702 | 5/2001 | C23C/16/00 |
| WO | WO 01/66832 | 9/2001 | C30B/25/14 |
| WO | WO 02/08485 | 1/2002 | C23C/16/00 |
| WO | WO 02/08488 | 1/2002 | C23C/16/44 |
| WO | WO 02/43115 | 5/2002 | |
| WO | WO 02/45167 | 6/2002 | H01L/27/00 |

OTHER PUBLICATIONS

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–6.

Kukli, et al., "Properties of $\{Nb_{1-x}Ta_x\}_2O_5$ Solid Solutions and $\{Nb_{1-x}Ta_x\}_2O_5$–$ZrO_2$ Nanolaminates Grown by Atomic Layer Epitaxy," 1997; p. 785–93.

Ritala, M., et al., "Chemical Vapor Deposition," Jan. 1999, p. 6–9.

Rossnagel, et al. "Plasma–enhanced Atomic Layer Deposition of Ta and Ti for Interconnect Diffusion Barriers," J. Vac. Sci. Technol. B., vol. 18, No. 4 (Jul. 2000); p2016–20.

Niinisto, et al. "Synthesis of Oxide Thin Films and Overlayers by Atomic Layer Epitaxy for Advanced Applications," Materials Science and Engineering B41 (1996) 23–29.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001.

U.S. Appl. No. 08/652,194, filed Jul. 13, 1994, Sivaramakrishnan et al.

U.S. Appl. No. 10/032,284, filed Dec. 21, 2001, Chen et al.

* cited by examiner

METHOD AND APPARATUS FOR GAS TEMPERATURE CONTROL IN A SEMICONDUCTOR PROCESSING SYSTEM

BACKGROUND OF THE INVENTION

1. Field of the Invention

Embodiments of the present invention generally relate to a method and apparatus for gas temperature control in a semiconductor processing system.

2. Description of the Related Art

Reliably producing sub-micron and smaller features is one of the key technologies for the next generation of very large scale integration (VLSI) and ultra large scale integration (ULSI) of semiconductor devices. However, as circuit technology continues to evolve, the shrinking dimensions of interconnects in VLSI and ULSI technology have placed growing demands for improved processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts, and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Atomic layer deposition is one deposition technique being explored for the deposition of material layers over features having high aspect ratios. One example of atomic layer deposition comprises the sequential introduction of pulses of gases. For instance, one cycle for the sequential introduction of pulses of gases may comprise a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality gases. Sequential introduction of separate pulses of the first reactant and the second reactant may result in the alternating, self-limiting absorption of monolayers of the reactants on the surface of the substrate, thus, forming a monolayer of material for each cycle. The cycle may be repeated to deposit material to a desired thickness. A pulse of a purge gas and/or a pump evacuation between the pulses of the first reactant gas and the pulses of the second reactant gas reduces the likelihood of gas phase reactions of the reactants due to excess amounts of the reactants remaining in the chamber.

As a single monolayer of material is deposited in each cycle, the ability to rapidly deliver and remove reactant and purge gases from the chamber has a substantial effect on substrate throughput. Using smaller volumes of gases reduces cycles times. However, when smaller volumes of gases are used, it becomes critical that the gas does not condense on the walls of the processing equipment. At such small volumes, condensation of the gas on the processing equipment walls prevents the accurate control and measured delivery of the gases to the processing chamber. Therefore, temperature control of gases delivered to a processing chamber becomes much more important than in conventional chemical vapor deposition (CVD) processing equipment.

Therefore, there is a need for processing methods and apparatus that enhance temperature control of gases delivered to semiconductor processing chambers.

SUMMARY OF THE INVENTION

One aspect of the present invention generally provides a gas temperature control apparatus for controlling the temperature of process gases flowing into a processing chamber. In one embodiment, a gas temperature control apparatus for semiconductor processing includes a gas delivery line coupled between a processing chamber and a gas source. An enclosure substantially encloses the gas delivery line and is adapted to flow a heat transfer fluid away from the processing chamber.

In another aspect of the invention, a method for controlling the temperature of gases flowing into a processing chamber is provided. In one embodiment, a method for controlling the temperature of gases flowing into a semiconductor processing chamber from a gas source includes flowing a heat transfer fluid through an enclosure from a first end disposed proximate the processing chamber towards a second end disposed proximate the gas source and flowing a gas through a gas delivery line substantially enclosed within the enclosure from the gas source to the processing chamber.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
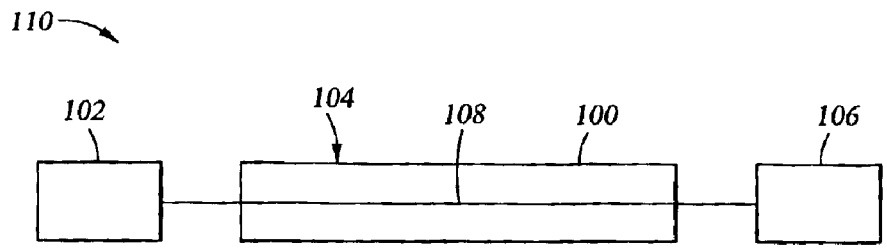
FIG. 1 is a simplified schematic view of a processing system utilizing a gas temperature control apparatus.

FIG. 1 is a simplified schematic of a processing system 110 having a gas delivery system 104 connecting a gas source 102 to a processing chamber 106. The gas delivery system 104 includes at least one gas delivery line 108 coupled between the gas source 102 and the processing chamber 106 and a gas temperature control apparatus 100 for controlling the temperature of at least one gas delivered via the gas delivery line 108 to the processing chamber 106.

The gas source 102 may be a single or multiple source coupled to the gas delivery system 104. The gas source 102 may be a local or remote vessel, a centralized facility source that supplies the gas throughout the facility, or any other suitable source of gas to be delivered to the processing chamber 106. The temperature controlled gases delivered to the processing chamber 106 may be a process gas, purge gas, cleaning gas, or other gas.

The processing chamber 106 is typically adapted for use in atomic layer deposition but may also be adapted for other deposition or substrate processing techniques such as chemical vapor deposition and physical vapor deposition, among others. Example of chambers that may be adapted to benefit from the invention are described in U.S. patent application Ser. No. 10/032,284; U.S. patent application Ser. No. 10/032,293; and U.S. patent application Ser. No. 10/016,300; which are hereby incorporated by reference.

Figure 2:
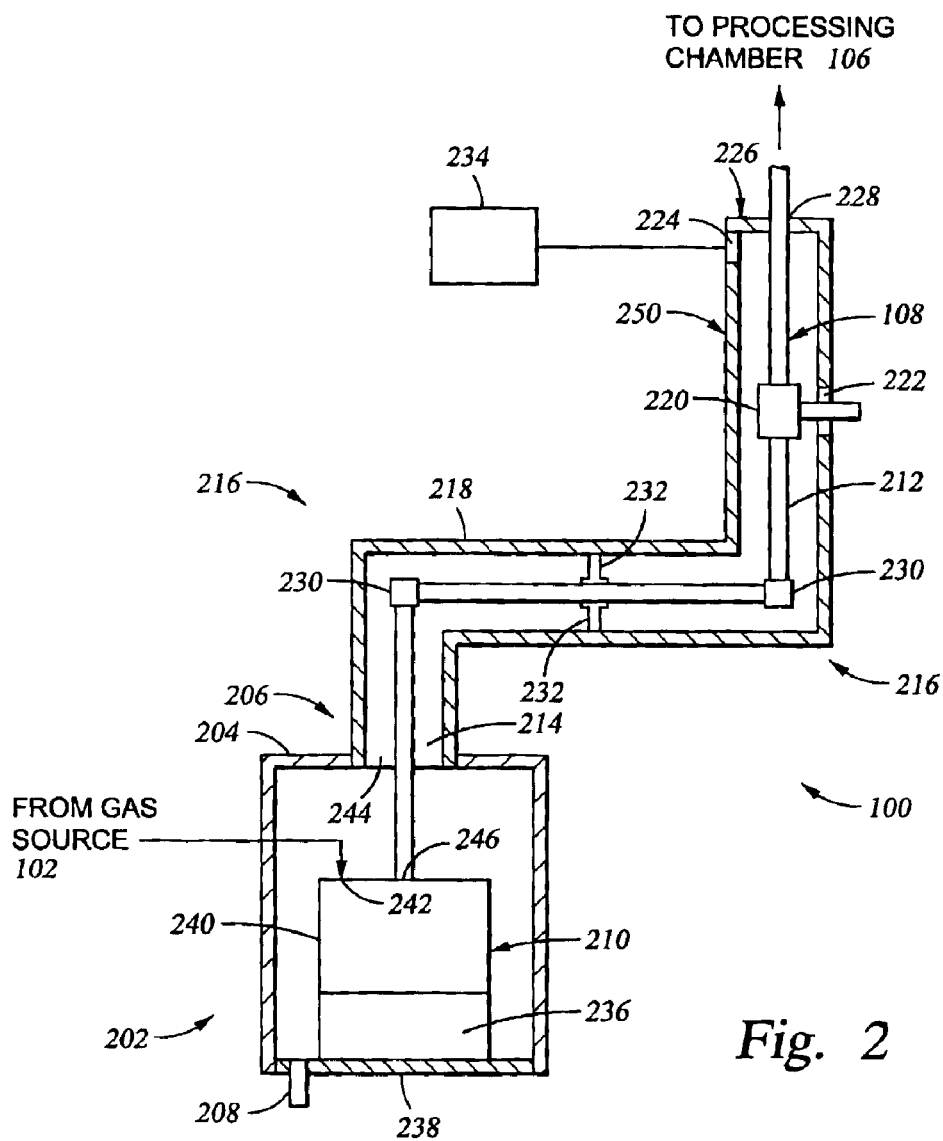
FIG. 2 is a sectional view of one embodiment of the gas temperature control apparatus.

FIG. 2 is a sectional view of one embodiment of a gas temperature control apparatus 100. The gas temperature control apparatus 100 includes an enclosure 250 which substantially encases at least a portion of the gas delivery line 108, defining a heat transfer fluid channel. The gas delivery line 108 includes at least a gas line 212 that couples a gas source 102 to a processing chamber 106. The gas line 212 may include multiple sections coupled by fittings 230. Valves 222 may also be disposed in the gas line 212. The configuration of the gas line 212 typically depends on the relative locations of the gas source 102 and the processing chamber 106 and the desired route of the gas line 212.

In one embodiment, the gas delivery line 108 includes a process gas generator 210. The process gas generator 210 is typically adapted to provide a process gas from a precursor 236. The process gas generator 210 includes an ampoule 240 with an input port 242 coupled to the gas source 102 and an output port 246 coupled to the gas line 212. The precursor 236 is disposed in the ampoule 240 and is either a liquid which vaporizes to a gas at a predefined temperature and pressure or a solid which sublimates to a gas at a predefined temperature and pressure. A gas from the gas source 102 flows through the ampoule 240 and carries the generated process gas into the processing chamber 106. Examples of suitable liquid precursors 236 include tetrakis (dimethylamino) tantalum (TDMAT), tertbutyliminotris (diethylamino) tantalum (TBTDET), and pentakis (ethylmethylamino) tantalum (PEMAT), among others. Examples of suitable solid precursors 236 include pentakis (dimethylamino) tantalum (PDMAT), xenon difluoride, nickel carbonyl, and tungsten hexacarbonyl, among others. One example of a suitable process gas generator 210 is described in U.S. patent application Ser. No. 10/198,727 filed Jul. 17, 2002 by Ganguli et al., which is hereby incorporated by reference.

The enclosure 250 of the gas temperature control apparatus 100 generally includes a conduit 218 that substantially encloses the gas delivery line 108. The conduit 218 has a heat transfer fluid inlet port 224 formed proximate a first end 226 proximate the processing chamber 106 and a heat transfer fluid outlet port 214 formed proximate a second end 206. A heat transfer fluid source 234 is coupled to the heat transfer fluid inlet port 224 and is adapted to flow a heat transfer fluid through the conduit 218 at a predefined temperature and rate. The heat transfer fluid source 234 may include a fluid supply, a heater, temperature sensors, valves, control circuitry, and the like (not shown) to control the temperature of the fluid introduced into the conduit 218. In order to prevent a non-uniform temperature gradient in the gas line 212, the conduit 218 is sized to avoid any restrictions in the flow of the heat transfer fluid due to fittings, valves, or other obstructions present in or on the gas delivery line 108.

A port 228 is formed in the first end 226 of the conduit 218 to allow the gas line 212 to pass through to the processing chamber 106. The first end 226 of the conduit 218 is typically disposed proximate the processing chamber 106 to limit cooling of the gases entering the processing chamber 106 through the gas line 212. In one embodiment, the first end 226 of the conduit 218 is coupled directly to the processing chamber 106 to provide temperature control of gases flowing into the processing chamber 106 from the gas line 212.

The path from the gas source 102 to the processing chamber 106 may not be a straight line and, therefore, the gas line 212 may not be in a straight line configuration. The conduit 218 follows the twists and turns of the gas line 212. Joints 216 which may exist at bends or other locations in the conduit 218 are typically butted together. Alternatively, the joints 216 may be taped, glued, press-fit, or otherwise sealed together to better contain the heated fluid flowing through the conduit 218. Optionally, spacers 232 may be used to support the gas line 212 and the conduit 218 and maintain their alignment. Spacers 232 may be of any design, but should not restrict the flow of the heated fluid through the conduit 218, thereby causing non-uniform heat transfer to the gas line 212.

In one embodiment, the enclosure 250 includes a container 202 coupled to the second end 206 of the conduit 218. The container 202 substantially encloses a process gas generator 210 that is coupled to the gas line 212. The gas line 212 passes through an opening 244 formed in a top 204 of the container 202. A heat transfer fluid exhaust vent 208 is formed in the bottom 238 of the container 202.

Figure 3:
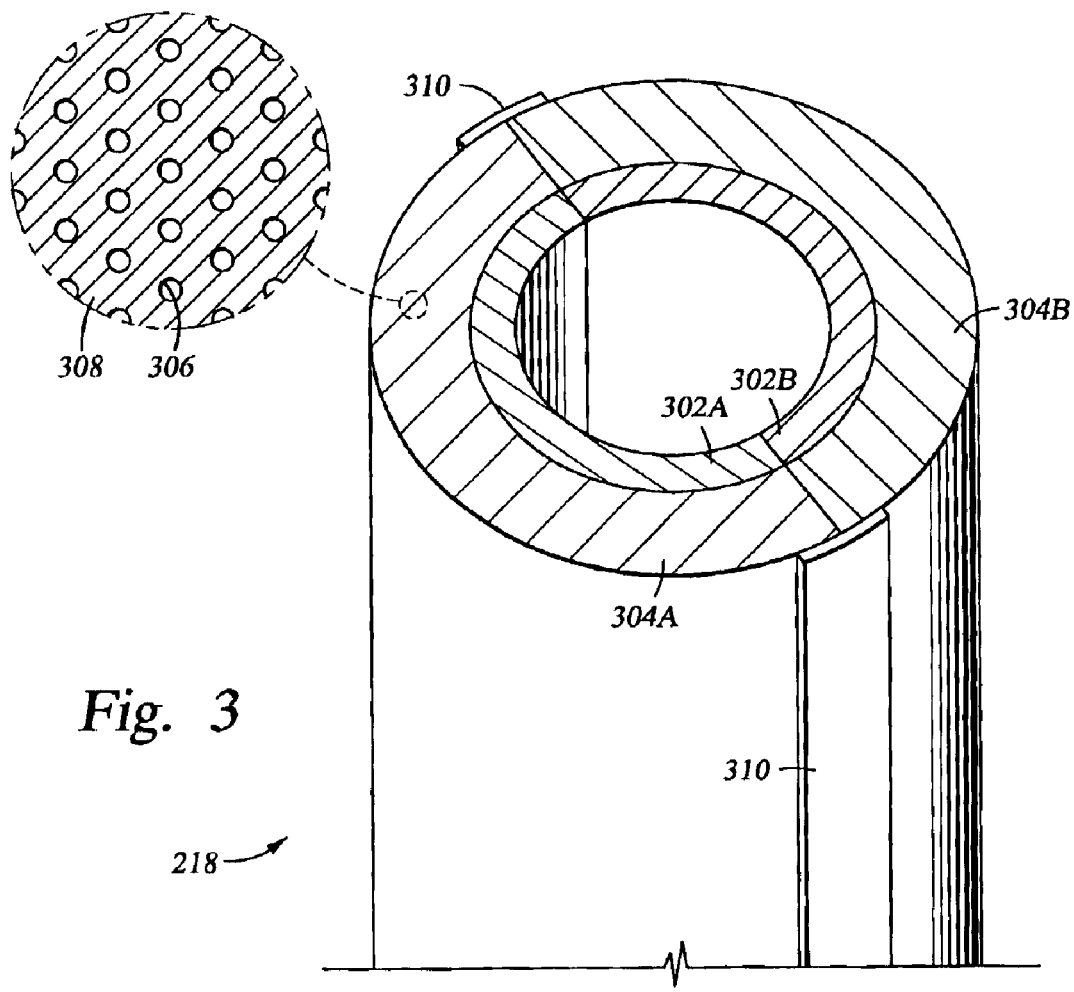
FIG. 3 depicts a sectional perspective view of one embodiment of the gas temperature control apparatus.

FIG. 3 depicts a sectional view of one embodiment of the conduit 218. A plurality of inner portions 302A, 302B and a plurality outer portions 304A, 304B (two of which are shown) are held together by one or more coupling devices 310 to form the conduit 218. The inner portions 302A, 302B are fabricated of metal or other material which is non-reactive with the heat transfer fluid and is compatible with operating temperatures. The inner portions 302A, 302B provide structural support and protect against degradation of the insulative properties of the outer portions 304A, 304B. The outer portions 304A, 304B are fabricated from an insulative material which slows heat loss from the conduit 218. In one embodiment, the insulative material is silicon rubber. However, any material otherwise compatible with the processing conditions which provides sufficient insulative properties will also suffice.

Optionally, the outer portions 304A, 304B may obtain further insulative qualities from air pockets 306 formed in the outer portions 304A, 304B. In the illustrated embodiment, the inner portions 302A, 302B and the outer portions 304A, 304B are semicircular halves which mate into a tubular shape. However, other shapes and sizes of the portions are contemplated which also substantially contain the heat transfer fluid within the conduit 218. Alternately, the conduit 218 may be made of a single piece of material, or multiple plies of material, which may be formed into a tubular shape to circumscribe the gas line 212 and possesses the insulative and physical properties to withstand the operating temperatures.

The coupling device 310 may be any device which serves to couple the two portions together such as adhesive, adhesive tape, hook and loop fasteners (such as VELCRO®), zippers, an o-ring, a cable tie, a metallic or plastic ring, a spring, a crimped band, a latch, a rivet, a bolt, an elastomer, press-fit band, an elastomeric band, and the like. Although the coupling device 310 is shown as running along the seam between the outer portions 308A, 308B, it is also contemplated that the coupling device 310 may instead be wrapped around the outer circumference of the conduit 218, rather than along the seam. For example, adhesive, a cable tie, a band, adhesive tape, hook and loop fasteners, and the like, may be wrapped around the conduit to hold it in place or the pieces may press-fit together. In one embodiment, the inner portions 302A, 302B are stainless steel and the outer portions 304A, 304B are silicon rubber and the coupling device 310 is adhesive tape.

In operation, process and/or purge gas(es) are introduced into the processing chamber 106 during a processing step. The valve 222 in the pipe 212 of the gas delivery line 108 is open to allow the gas(es) to flow from the gas source 102 and/or process gas generator 210 through the pipe 212 and into the processing chamber 106. A heat transfer fluid is introduced into the enclosure 250 that surrounds the pipe 212 through the heat transfer fluid inlet port 224 from the heat transfer fluid source 234. The heat transfer fluid may be nitrogen, air, or other inert fluid. The heat transfer fluid flows through the conduit 218 into the container 202 and finally exits out a vent 208. The heat transfer fluid transfers heat to or from the gas line 212 and the process gas generator 210 creating a controllable temperature profile of the process gases flowing to the process chamber 106. In one embodiment, nitrogen heated to about 90 degrees Celsius is introduced at a flow rate of about 30 L/min. to control the temperature of the gases flowing through the gas line 212. The rate at which gases flow through the gas line 212 is typically in the range of 100–300 sccm. The carrier gas is typically provides at a temperature of about 65 to about 90 degrees Celsius. This results in a temperature profile of the gas in the gas line 212 of from about 90 degrees Celsius near the processing chamber 106 to about 70 degrees Celsius at the process gas source 210. This temperature profile advantageously prevents the precursor from condensing in the processing chamber 106 as it exits the gas line 212. Alternatively, other fluids at other temperatures may be flowed through the conduit 218 in order to control the temperature of gases flowing through the gas line 212 and prevent condensation before reaching the processing chamber 106.

In another embodiment, the flow direction of the heat transfer gas in the conduit 218 may be reversed. For example, heated nitrogen or other gas may be introduced into the conduit through the heat transfer fluid outlet port 214 (or the vent 208) and exit the conduit 218 through the heat transfer fluid inlet port 224. The temperature of the heat transfer gas is maintained at a level that prevents condensation within the gas line 212.

Figure 4:
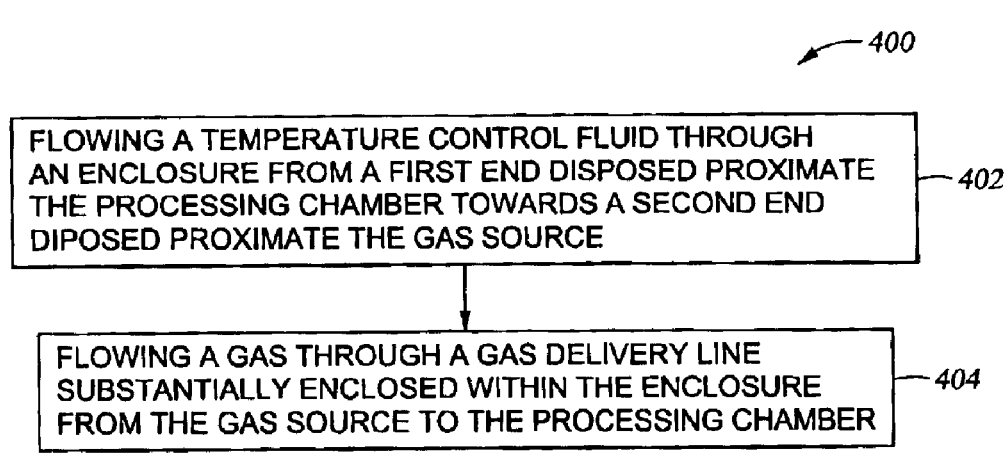
FIG. 4 is a flow diagram of a method for controlling temperature of a process gas.

FIG. 4 depicts a flow diagram of a method 400 for controlling the temperature of process gases flowing into a semiconductor processing chamber 106. At step 402, a heat transfer fluid is flowed through a conduit 218 from a first end 226 disposed proximate a processing chamber 106 towards a second end 206 disposed proximate a gas source 102. At step 404, a process gas is flowed through a gas line 212 disposed within the conduit 218 from the gas source 102 into the processing chamber 106. In one embodiment, the step of flowing a heat transfer fluid further includes directing the heat transfer fluid flowing through the conduit 218 into a canister 202 surrounding the process gas generator 210.

While foregoing is directed to the preferred embodiment of the present invention, other and further embodiments of the invention may be devised without departing from the basic scope thereof, and the scope thereof is determined by the claims that follow.

What is claimed is:

1. A gas temperature control apparatus for semiconductor processing, comprising:
    a processing chamber;
    a gas source;
    a gas delivery line coupled at a first end to the processing chamber and coupled at a second end to the gas source;
    an enclosure enclosing at least a portion of the gas delivery line and defining a heat transfer fluid channel adapted to flow a heat transfer fluid therein towards the second end of the gas delivery line; and
    a process gas generator disposed within the enclosure and fluidly coupled between the gas source and the gas delivery line.

2. The gas temperature control apparatus of claim 1, wherein the process gas generator contains a material adapted to form a semiconductor process gas at a predefined temperature and pressure.

3. The gas temperature control apparatus of claim 2, wherein the material is selected from the group consisting of pentakis (dimethylamino) tantalum (PDMAT), tetrakis (dimethylamino) titanium (TDMAT), tertbutyliminotris (diethylamino) tantalum (TBTDET), pentakis (ethylmethylamino) tantalum (PEMAT), xenon difluoride, nickel carbonyl, and tungsten hexacarbonyl.

4. A gas temperature control apparatus for semiconductor processing, comprising:
    a processing chamber;
    a gas source;
    a gas delivery line coupled at a first end to the processing chamber and coupled at a second end to the gas source; and
    an enclosure enclosing at least a portion of the gas delivery line, wherein the enclosure comprises an inner portion and an outer portion about the inner portion and defining a heat transfer fluid channel adapted to flow a heat transfer fluid therein towards the second end of the gas delivery line, and wherein the inner portion is comprised of stainless steel and the outer portion is comprised of silicon rubber.

5. The gas temperature control apparatus of claim 4, wherein the outer portion further comprises air pockets formed in silicon rubber.

6. A gas temperature control apparatus for semiconductor processing comprising:
    a processing chamber;
    a gas source;
    a process gas generator coupled to the gas source;
    a gas delivery line coupled at a first end to the process gas generator and coupled at a second end to the processing chamber; and
    means for creating a declining temperature gradient in a direction away from the processing chamber.

7. The gas temperature control apparatus of claim 6, wherein the means for creating a declining temperature gradient comprises:
    an enclosure substantially enclosing the gas delivery line and the process gas generator, the enclosure adapted for flowing a heat transfer fluid therein towards the first end of the gas delivery line.

8. The gas temperature control apparatus of claim 7, wherein the enclosure has an inlet formed therethrough proximate the processing chamber.

9. The gas temperature control apparatus of claim 8, wherein the enclosure further comprises an exhaust vent formed proximate the gas source.

10. The gas temperature control apparatus of claim 7, further comprising at least one spacer coupled between the gas delivery line and the enclosure.

11. The gas temperature control apparatus of claim 7, wherein the enclosure further comprises:

a metal inner portion; and an insulative outer portion.

12. The gas temperature control apparatus of claim 11, wherein the inner portion is comprised of stainless steel and the outer portion is comprised of silicon rubber.

13. The gas temperature control apparatus of claim 11, wherein the outer portion further comprises air pockets formed in silicon rubber.

14. The gas temperature control apparatus of claim 7, wherein the enclosure further comprises multiple sections.

15. The gas temperature control apparatus of claim 14, further comprising at least one coupling device which secures the sections of the enclosure together.

16. The gas temperature control apparatus of claim 15, wherein at least one of the coupling devices is selected from the group consisting of adhesive, adhesive tape, hook and loop fasteners, zippers, an o-ring, a cable tie, a metallic ring, a plastic ring, a spring, a crimped band, a latch, a rivet, a bolt, an elastomer, press-fit band, and an elastomeric band.

17. The gas temperature control apparatus of claim 6, wherein the process gas generator contains a material adapted to form a semiconductor process gas at a predefined temperature and pressure.

18. The gas temperature control apparatus of claim 17, wherein the material is selected from the group consisting of pentakis (dimethylamino) tantalum (PDMAT), tetrakis (dimethylamino) titanium (TDMAT), tertbutyliminotris (diethylamino) tantalum (TBTDET), pentakis (ethylmethylamino) tantalum (PEMAT), xenon difluoride, nickel carbonyl, and tungsten hexacarbonyl.

19. The gas temperature control apparatus of claim 17, wherein the gas source provides argon, helium, or nitrogen and the heat transfer fluid is nitrogen or air.

* * * * *